(12) United States Patent
Shiffer

(10) Patent No.: US 7,193,300 B2
(45) Date of Patent: Mar. 20, 2007

(54) PLASTIC LEADFRAME AND COMPLIANT FASTENER

(75) Inventor: Stephen R. Shiffer, Pearl City, IL (US)

(73) Assignee: Honeywell International Inc., Morristown, NJ (US)

( * ) Notice: Subject to any disclaimer, the term of this patent is extended or adjusted under 35 U.S.C. 154(b) by 214 days.

(21) Appl. No.: 10/939,658

(22) Filed: Sep. 13, 2004

(65) Prior Publication Data
US 2006/0057781 A1 Mar. 16, 2006

(51) Int. Cl.
H01L 23/495 (2006.01)
H01L 23/04 (2006.01)
H05K 7/00 (2006.01)
H05K 1/14 (2006.01)
H01B 17/20 (2006.01)

(52) U.S. Cl. ............ 257/677; 257/698; 361/760; 361/767; 174/194; 174/200

(58) Field of Classification Search .......... 257/677, 257/697–698; 361/760–762, 767, 785, 791; 174/194, 200
See application file for complete search history.

(56) References Cited

U.S. PATENT DOCUMENTS

| | | | | |
|---|---|---|---|---|
| 5,199,889 A | * | 4/1993 | McDevitt, Jr. | 439/66 |
| 5,276,289 A | * | 1/1994 | Satoh et al. | 174/260 |
| 5,366,332 A | | 11/1994 | Murphy | 411/509 |
| 5,481,436 A | * | 1/1996 | Werther | 361/784 |
| 5,563,442 A | | 10/1996 | Mahulikar et al. | 257/666 |
| 5,744,383 A | | 4/1998 | Fritz | 438/111 |
| 5,777,852 A | * | 7/1998 | Bell | 361/769 |
| 5,953,214 A | * | 9/1999 | Dranchak et al. | 361/767 |
| 6,028,352 A | | 2/2000 | Eide | 257/686 |
| 6,325,280 B1 | * | 12/2001 | Murphy | 228/246 |
| 6,699,046 B2 | * | 3/2004 | Ho et al. | 439/70 |
| 6,707,135 B2 | | 3/2004 | Madrid | 257/666 |
| 6,803,650 B2 | * | 10/2004 | Crane, Jr. et al. | 257/697 |
| 2002/0182773 A1 | | 12/2002 | Su et al. | 438/111 |
| 2004/0080921 A1 | * | 4/2004 | Paola | 361/785 |

* cited by examiner

*Primary Examiner*—Luan Thai
(74) *Attorney, Agent, or Firm*—Kermit D. Lopez; Luis M. Ortiz; William B. Shelby

(57) ABSTRACT

Packaging assembly method and systems include the use of a plastic substrate and one or more compliant fasteners, which can be connected to the plastic substrate, such that the compliant fastener provides an electrical connection to one or more electrical components. A plastic leadframe can therefore be formed, which is based upon the plastic substrate and the compliant fastener for attachment to other electrical components. The plastic substrate itself can function as a plastic trace or plastic substrate trace, and can be formed from plastic material such as thermoplastic or a thermoset material. The compliant fastener itself can be pushed into the plastic substrate at a connection point thereof for attachment of the compliant fastener to the plastic substrate. The connection point can be formed in the plastic substrate as one or more round holes, slots, rectangular holes or complex shapes. An interface is therefore formed between the plastic trace and the compliant fastener.

18 Claims, 3 Drawing Sheets

PLASTIC LEADFRAME AND COMPLIANT FASTENER

TECHNICAL FIELD

Embodiments are generally related to integrated circuit manufacturing and assembly processes, including the packaging of electrical components. Embodiments also relate to plastic leadframes and compliant fasteners.

BACKGROUND OF THE INVENTION

Most electronic packages, which include sensors connected to input/output devices thereof, utilize leadframes, a PCB, or combinations thereof. Such electronic packages generally require that a conductors and/or insulators connect from a sensing element to the outside of the package for a customer to properly interface with the device. Leadframes provide customized configurations in which a designer can create many packages in order to meet a customer's overall need. Unfortunately, all of this customization must link in some electrical means to create a device. Common methods of connecting to leadframes including wire bonding and soldering techniques. Both of these connecting methods require that the leadframe be plated. Common plating material for wire bonding involves the use of gold, while tin is often utilized for soldering.

A number of complications are involved in the use of leadframes. For example, leadframes require cleaning following stamping and prior to plating in order to remove excessive oils and contaminates. Leadframes also function as a conductor and require an insulator to allow a usable electronic connection. Leadframes additionally require a significant capital investment to produce the conductor. The ability of a leadframe to be manipulated into a desired package configuration is very limited because the method of production chosen typically involves stamping. The simplest leadframe would be flat and straight. Any deviation from the simple design requires significant effort to ensure that angles and bends are precise for not only the package configuration, but also interface with the overmold process. It can thus be appreciated that the use of leadframes presents a number of assembly and manufacturing issues.

An alternative to leadframes is the PCB (Printed Circuit Board), which has become an economical means for producing circuitry utilizing copper foil, fiberglass, and resin to create the insulated conductor. This method maximizes the efficiency of the conductor when compared to the leadframe, because the conductor material requirement comes closer to meeting the electrical requirements required by the circuit. Yet, PCB issues include the cost of the board when the size becomes large. In addition, the conductor is merely flat.

Also, a requirement exists to provide an interconnect to the PCB in order to interface with the customer's I/O. Due to the standardization of PCBs, the designer must attempt to optimize the area within the panel. Additionally, routing may be required, not only to give the PCB dimensional size, but also to disconnect from the panel. Thus, the use of PCB components can result in a number of problems in component assembly and manufacturing, which may not in fact be superior the use of lead frames.

In creating small electronic components, such as sensor devices, for example, packing designs utilize metal conductors and/or leadframes to connect such devices to an input component, which is typically not cost-effective with respect to the overall assembly and manufacturing process. The solution to such cost issues touches many elements of the resulting component structure, such as material, labor and capital. A need thus exists for an assembly process, which overcomes these cost issues, while also providing the full capabilities of devices, such as leadframes and/or metal conductor components.

In general, plastic traces for plastic leadframes can be created utilizing processes such MID, EXACT, and vacuum metalizing. A compliant fastener can also be implemented wherein a stamped component replaces the solder joint in a PCB connection. Compliant technology was developed by the U.S. government in the 1970's to eliminate solider joint in aircrafts due to reworking requirements thereof. A compliant joint can maintain its connection under thermal shock conditions. It is believed that a solution to the aforementioned problems lies in the combined use of compliant fasteners and plastic leadframe technology.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide for improved packaging assembly methods and systems.

It is another aspect of the present invention to provide for improved packaging assembly methods and systems, which incorporate plastic leadframes and compliant fasteners.

The aforementioned aspects of the invention and other objectives and advantages can now be achieved as described herein. Packaging assembly method and systems are disclosed. In general, a plastic substrate can be provided. Thereafter, one or more compliant fasteners can be connected to the plastic substrate, wherein the compliant fastener provides an electrical connection to one or more electrical components. A plastic leadframe can therefore be formed, which is based upon the plastic substrate and the compliant fastener for attachment to other electrical components. The plastic substrate itself can function as a plastic trace or plastic substrate trace, and can be formed from plastic material such as thermoplastic or a thermoset material. The compliant fastener itself can be pushed into the plastic substrate at a connection point thereof for attachment of the compliant fastener to the plastic substrate. The connection point can be formed in the plastic substrate as one or more round holes, slots, rectangular holes or complex shapes. An interface is therefore for med between the plastic trace and the compliant fastener.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate at least one embodiment of the present invention and are not intended to limit the scope of the invention.

Figure 1:
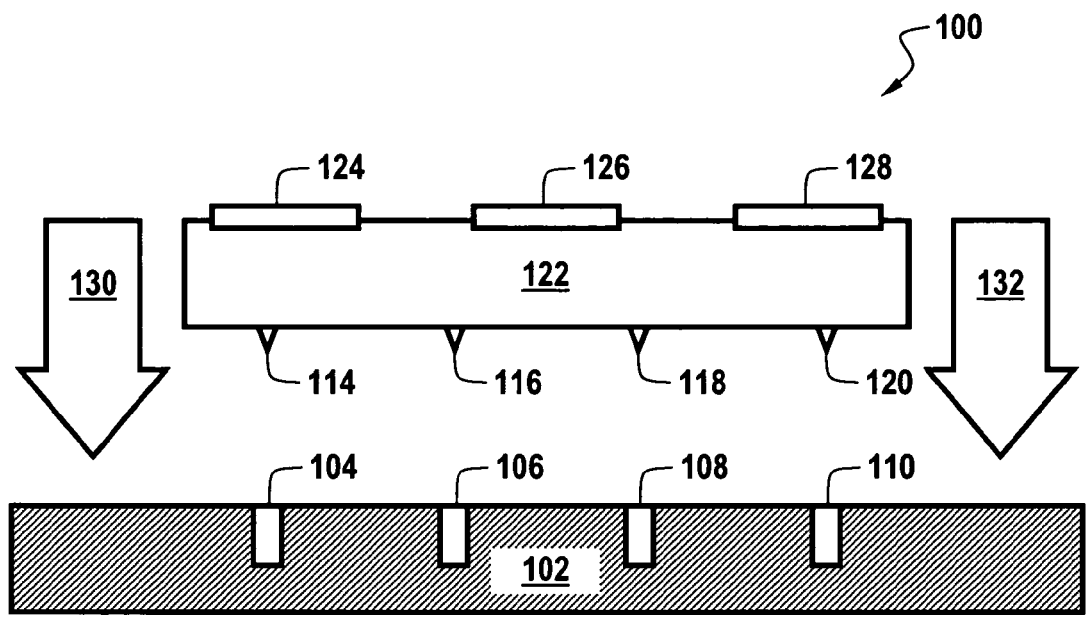
FIG. 1 illustrates a block diagram of a plastic substrate and a compliant fastener, which can be utilized to form a packaging assembly in accordance with an embodiment of the present invention.
Figure 2:
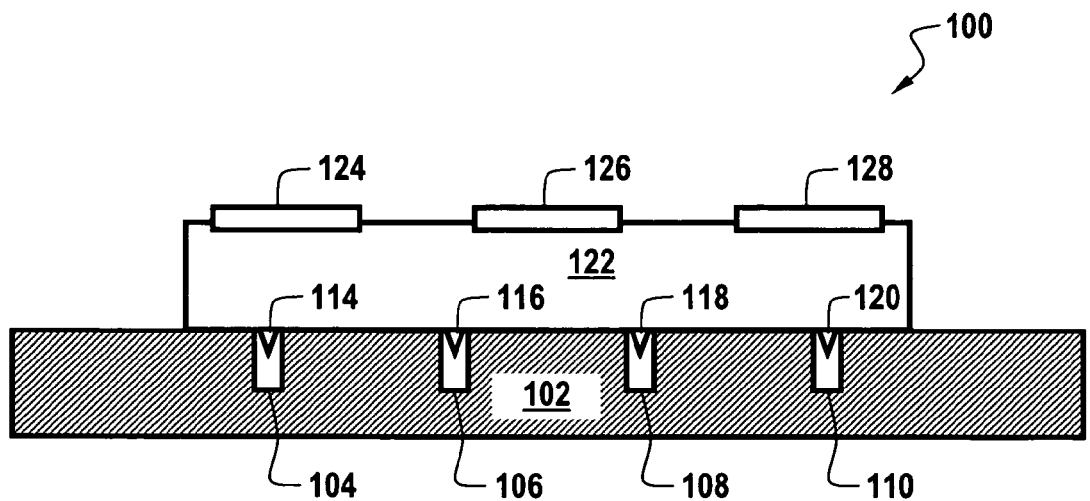
FIG. 2 illustrates a block diagram of the plastic substrate and compliant fastener of FIG. 1 connected together to form a packaging assembly in accordance with an embodiment of the present invention.

FIG. 1 illustrates a block diagram of a plastic substrate 102 and a compliant fastener 122, which can be utilized to form a packaging assembly 100 in accordance with an embodiment of the present invention. FIG. 2 illustrates a block diagram of the plastic substrate 102 and compliant fastener 122 of FIG. 1 connected together to form packaging assembly 100 in accordance with an embodiment of the present invention. Note than in FIGS. 1–5, identical or analogous parts are generally indicated by identical reference numerals.

Plastic substrate 102 can be configured as a plastic substrate trace, which can be utilized as a basis for forming a plastic leadframe structure. Plastic substrate 102 includes one or more holes 104, 106, 108, 110 for respectively receiving one or more connecting pins 114, 116, 118, 120 of compliant fastener 122. Pins 114, 116, 118, 120 can function as compliant pins, which form leadframe pins. Compliant fastener 122 in turn includes one or more metallic and/or discrete conducting connectors 124, 126, 128 to which other electrical components such as sensor components and so forth. Compliant fastener 122 thus can provide an electrical connection to one or more other electrical components.

A plastic leadframe can therefore be formed, which is based upon the plastic substrate 102 and the compliant fastener 122 for attachment to other electrical components. Such a leadframe generally includes compliant/leadframe pins 114, 116, 118, 120, which can be plated through holes within the plastic substrate 102. The plastic substrate 102 can be formed from plastic material such as thermoplastic or a thermoset material. The compliant fastener 122 can be pushed into the plastic substrate 102 at one or more connection points thereof (i.e., holes 104, 106, 108, and 110) for attachment of the compliant fastener 122 to the plastic substrate 102 in the general direction indicated by arrows 130 and 132 shown in FIGS. 1–2. In the configurations of FIGS. 1–2, compliant fastener 122 and plastic substrate 102, when attached to one another, form an interface therebetween. Compliant fastener 122 can be implemented as a fastener which joins two or more members together, such as, for example, plastic substrate 102 and any discrete components (not shown in FIGS. 1–2), which may be connected to connectors 124, 126, 128.

Figure 3:
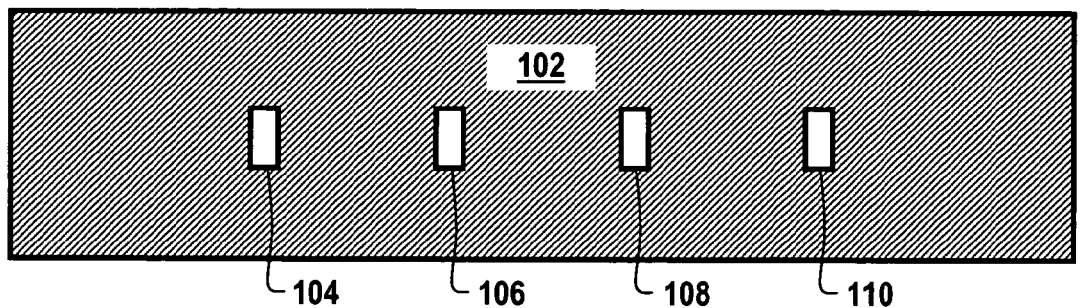
FIG. 3 illustrates a top view of a plastic substrate, which can be configured to include rectangular holes for receiving a compliant fastener, in accordance with one embodiment of the present invention.
Figure 4:
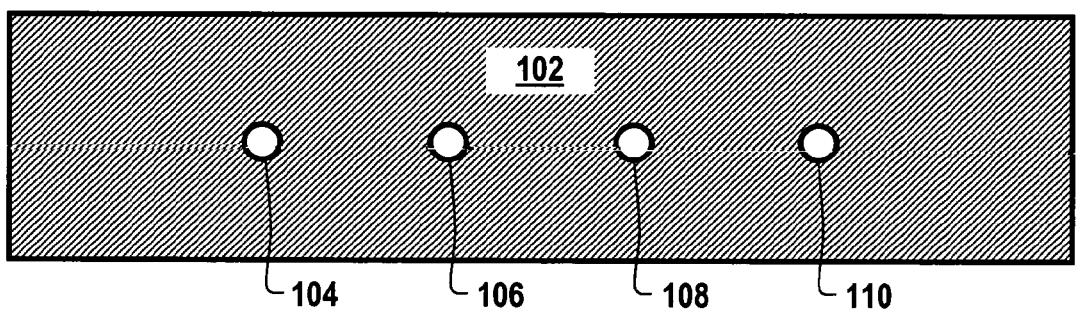
FIG. 4 illustrates a top view of a plastic substrate, which can be configured to include round holes for receiving a compliant fastener, in accordance with another embodiment of the present invention.
Figure 5:
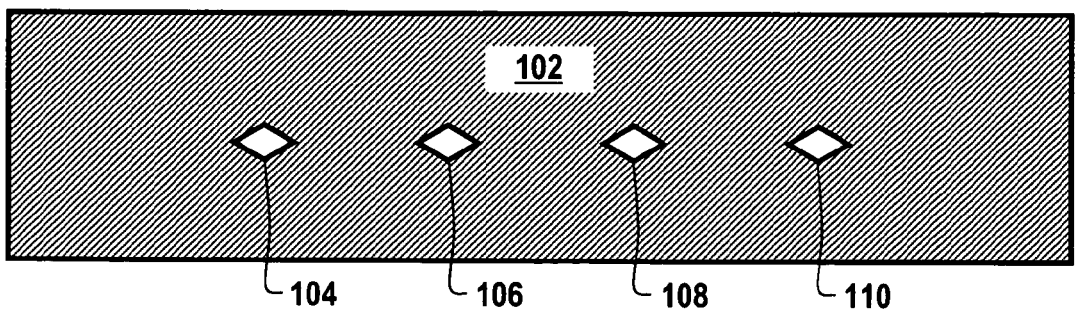
FIG. 5 illustrates a top view of a plastic substrate, which can be configured to include holes having a complex shape for receiving a compliant fastener, in accordance with an alternative embodiment of the present invention.

FIG. 3 illustrates a top view of plastic substrate 102, which can be configured to include rectangular holes 104, 106, 108, 110 for receiving compliant fastener 122, in accordance with one embodiment of the present invention. FIG. 4 illustrates a top view of plastic substrate 102, which can be configured to include round holes 104, 106, 108, 110 for receiving compliant fastener 1212, in accordance with another embodiment of the present invention. FIG. 5 illustrates a top view of plastic substrate 102, which can be configured to include holes 104, 106, 108, 110 having a complex shape for receiving compliant fastener 122, in accordance with an alternative embodiment of the present invention. Thus, the connection point(s) within the plastic substrate 102 can be formed in the shape of round holes, slots, rectangular holes, or other complex shapes.

Figure 6:
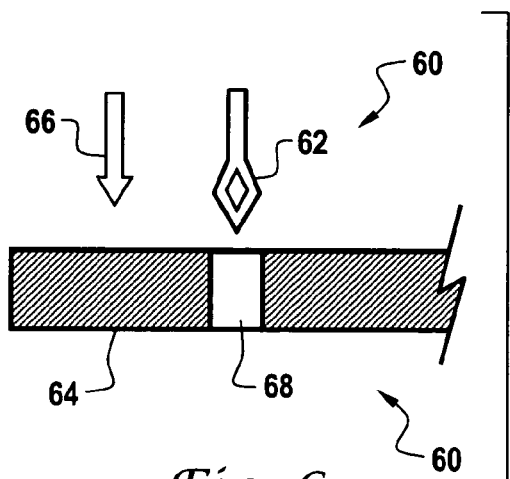
FIG. 6 illustrates a side view of a system that includes a plastic leadframe and a compliant terminal with a lead or metal leadframe, in accordance with a preferred embodiment of the present invention.

FIG. 6 illustrates a side view of a system 60 that includes a plastic leadframe (PLF) 64 and a compliant terminal 62 with a lead or metal leadframe, in accordance with a preferred embodiment of the present invention. Compliant terminal 62 can connected to plastic leadframe 64 via a hole 68. Arrow 66 indicates the general direction compliant terminal 62 must take to mate with plastic lead frame 64 via hole 68. System 60 therefore illustrates a lead frame to terminal-to-PLF configuration.

Figure 7:
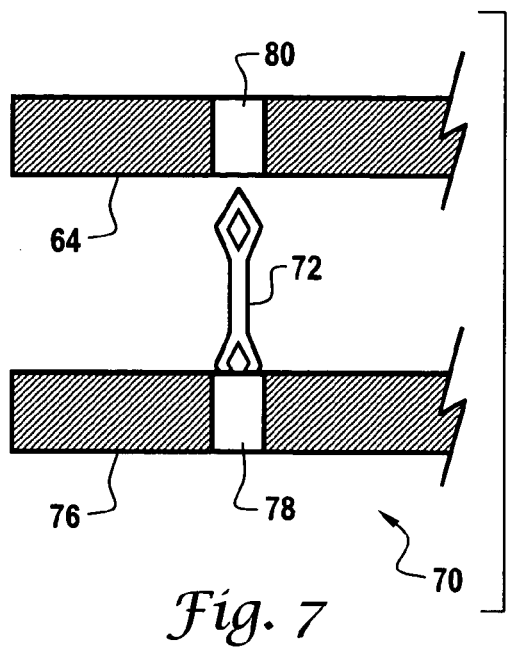
FIG. 7 illustrates a side view of a system that includes a compliant fastener in a double connection style configuration in association with a plastic leadframe, in accordance with an alternative embodiment of the present invention.

FIG. 7 illustrates a side view of a system 70 that includes a compliant fastener 72 in a double connection style configuration in association with a plastic leadframe 76 and a PCB 74, in accordance with an alternative embodiment of the present invention. Compliant fastener 72 can mate with PCB 74 via a hole 80 and plastic leadframe 76 via a hole 78. System 70 therefore illustrates a PCB-to-PLF configuration.

Figure 8:
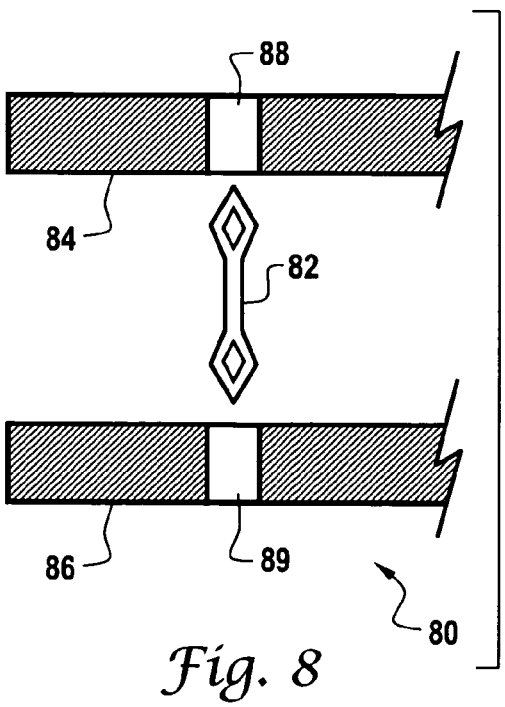
FIG. 8 illustrates a side view of a system that includes a compliant fastener in a double connection style configuration and two plastic leadframes in accordance with an alternative embodiment of the present invention.

FIG. 8 illustrates a side view of a system 80 that includes a compliant fastener 82 in a double connection style configuration and two plastic leadframes 84 and 86 in accordance with an alternative embodiment of the present invention. Compliant fastener 82 can mate with plastic leadframe 84 via a hole 88. Similarly, compliant fastener 82 can mate with plastic leadframe 86 via a hole 89. System 80 therefore illustrates a PLF-to-PLF configuration.

Figure 9:
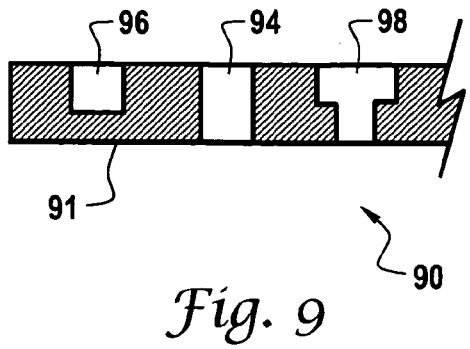
FIG. 9 illustrates a system that includes varying hole configurations, in accordance with an alternative embodiment of the present invention.

FIG. 9 illustrates a system 90 that includes varying hole configurations, in accordance with an alternative embodiment of the present invention. System 90 generally includes a plastic leadframe 91 having one or more holes 96, 94, and 98 of varying shapes. System 90 is described and illustrated herein in order to demonstrate that a PLF can be implemented with holes of varying sizes.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

The embodiments of the invention in which an exclusive property or right is claimed are defined as follows.

Having thus described the invention what is claimed is:

1. A packaging assembly method, comprising the steps of:
providing a plastic substrate;
configuring said plastic substrate as a plastic trace assembly;
connecting at least one compliant fastener to said plastic trace assembly, wherein said at least one compliant fastener provides an electrical connection to at least one electrical component; and
forming a plastic leadframe packaging assembly from said plastic trace assembly and said at least one compliant fastener, wherein said plastic leadframe packaging assembly can attach to electrical components thereof.

2. The method of claim 1 further comprising the step of forming said plastic trace assembly from thermoplastic.

3. The method of claim 1 further comprising the step of forming said plastic trace assembly from a thermoset material.

4. The method of claim 1 wherein the step of connecting at least one compliant fastener to said plastic trace assembly, further comprises the step of:
pushing said at least one compliant fastener into said plastic trace assembly at a connection point thereof for attachment of said at least one compliant fastener to said plastic trace assembly.

5. The method of claim 4 further comprising the step of forming at least one round hole from said plastic trace assembly at said connection point of said plastic trace assembly for receiving said at least one compliant fastener.

6. The method of claim 4 further comprising the step of forming at least one slot from said plastic trace assembly at said connection point of said plastic trace assembly for receiving said at least one compliant fastener.

7. The method of claim 4 further comprising the step of forming at least one rectangular hole from said plastic trace assembly at said connection point of said plastic trace assembly for receiving said at least one compliant fastener.

8. The method of claim 4 further comprising the step of forming at least one complex shape from said plastic trace assembly at said connection point of said plastic trace assembly for receiving said at least one compliant fastener.

9. The method of claim 1 further comprising the step of permitting said plastic trace assembly and said at least one compliant fastener to form an interface thereof, in response to connecting said at least one compliant fastener to said plastic trace assembly.

10. A packaging assembly system, comprising:
a plastic substrate configured as a plastic trace assembly;
at least one compliant fastener connected to said plastic trace assembly, wherein said at least one compliant fastener provides an electrical connection to at least one electrical component; and
a plastic leadframe packaging assembly formed from said plastic trace assembly and said at least one compliant fastener, wherein said plastic leadframe packaging assembly can attach to electrical components thereof.

11. The system of claim 10 wherein said at least one compliant fastener is pushed into said plastic trace assembly at a connection point thereof for attachment of said at least one compliant fastener to said plastic trace assembly.

12. The system of claim 11 wherein said plastic trace assembly comprises at least one round hole at said connection point of said plastic trace assembly for receiving said at least one compliant fastener.

13. The system of claim 11 wherein said plastic trace assembly substrate comprises at least one slot at said connection point of said plastic trace assembly for receiving said at least one compliant fastener.

14. The system of claim 11 wherein said plastic trace assembly comprises at least one rectangular hole at said connection point of said plastic trace assembly for receiving said at least one compliant fastener.

15. The system of claim 11 wherein said plastic trace assembly comprises at least one complex shape at said connection point of said plastic trace assembly for receiving said at least one compliant fastener.

16. The system of claim 10 wherein said plastic trace assembly and said at least one compliant fastener form an interface thereof, in response to connecting said at least one compliant fastener to said plastic trace assembly.

17. A packaging assembly system, comprising:
a plastic substrate comprising a plastic trace assembly; and
at least one compliant fastener connected to said plastic trace assembly, wherein said at least one compliant fastener is pushed into said plastic trace assembly at a connection point thereof for attachment of said at least one compliant fastener to said plastic trace assembly and wherein said at least one compliant fastener provides an electrical connection to at least one electrical component, in order form a plastic leadframe packaging assembly based upon said plastic trace assembly and said at least one compliant fastener for attachment to electrical components thereof.

18. The system of claim 17 wherein said plastic trace assembly and said at least one compliant fastener form an interface thereof, in response to connecting said at least one compliant fastener to said plastic trace assembly.

* * * * *

UNITED STATES PATENT AND TRADEMARK OFFICE
CERTIFICATE OF CORRECTION

PATENT NO. : 7,193,300 B2 Page 1 of 1
APPLICATION NO. : 10/939658
DATED : March 20, 2007
INVENTOR(S) : Stephen R. Shiffer It is certified that error appears in the above-identified patent and that said Letters Patent is hereby corrected as shown below:

In Column 6, line 24, delete "substrate".

Signed and Sealed this

Twenty-fourth Day of July, 2007

JON W. DUDAS
*Director of the United States Patent and Trademark Office*